(12) United States Patent
Barkley et al.

(10) Patent No.: US 6,487,706 B1
(45) Date of Patent: Nov. 26, 2002

(54) CONTRACT METHODOLOGY FOR CONCURRENT HIERARCHICAL DESIGN

(75) Inventors: Keith G. Barkley, Poughquaq, NY (US); Peter J. Camporese, Hopewell Junction, NY (US); Kwok Fai Eng, Kingston, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 09/651,464

(22) Filed: Aug. 30, 2000

(51) Int. Cl.[7] ............................................. G06F 17/50
(52) U.S. Cl. ........................................... 716/7; 716/13
(58) Field of Search ................................ 700/97; 716/4, 716/10, 2, 9, 8, 1, 21

(56) References Cited

U.S. PATENT DOCUMENTS

| | | | | |
|---|---|---|---|---|
| 4,918,614 A | * | 4/1990 | Modarres et al. ............... | 716/4 |
| 5,191,542 A | * | 3/1993 | Murofushi ...................... | 716/9 |
| 5,485,396 A | * | 1/1996 | Brasen et al. ................... | 716/9 |
| 5,528,508 A | * | 6/1996 | Russel et al. ................... | 716/8 |
| 5,808,899 A | * | 9/1998 | Scepanovic et al. ........... | 716/2 |
| 6,085,032 A | * | 7/2000 | Scepanovic et al. ........... | 716/10 |
| 6,198,978 B1 | * | 3/2001 | Takahashi ...................... | 700/97 |

* cited by examiner

Primary Examiner—Matthew Smith
Assistant Examiner—H Rossoshek
(74) Attorney, Agent, or Firm—Lynn L. Augspurger (57) ABSTRACT

A method for partitioning wiring connecting individual physical elements of a VLSI chip of a hierarchical design having multiple levels, begins by defining a size for the chip of a hierarchical design, and then removing blocked areas, including clock and power grid areas leaving the wiring channels available for interconnecting the individual elements of the VLSI chip. A percentage of the available area is allocated for wiring levels for global and local wiring as parallel iterations for the global and local wiring proceed and modified as the parallel iterations for the global and local wiring progress. During the parallel iterative process the number of wires increases for the power grid area to prevent a signal wire from having an active wire on either side of the signal wire. In the interactive process, a vertical slice of wiring resources used for the space above a macro entity is defined and the macro entity is checked with the context of the VLSI chip physical design above it. The process employs a blockage modeling tool to accurately wire DRC correct wiring designs using automatic routing tools.

2 Claims, 7 Drawing Sheets

CONTRACT METHODOLOGY FOR CONCURRENT HIERARCHICAL DESIGN

FIELD OF THE INVENTION

This invention relates to wiring design for VLSI chips, and particularly to a method for partitioning wiring resources for connecting individual physical elements of a VLSI chip of a hierarchical design having multiple levels of hierarchy.

TRADEMARKS

S/390 and IBM are registered trademarks of International Business Machines Corporation, Armonk, New York, U.S.A. Other names may be registered trademarks or product names of International Business Machines Corporation or other companies.

BACKGROUND

As chip circuit densities increase, design implementation cycles decrease, and performance requirements increase, custom design techniques are employed to drive the performance to required levels. It has become increasingly important to be able to physically partition the chip more effectively with the goal of doing physical design implementation on the individual partitions in parallel as well as doing the physical design between the partitions with the partitions abstracted. One of the problems encountered when employing a concurrent, independently iterative and parallel execution of a hierarchical design technique is that the physical design resources need to be partitioned among the design elements in such a way as to allow the elements physical implementation to proceed concurrently while insuring that the overall design integrity is maintained (i.e. no conflicts in resources is encountered once the elements are assembled on the chip). The techniques we had tried before were not effective until we came upon the improvements described herein for the design of IBM's S/390 chipsets.

SUMMARY OF THE INVENTION

This disclosure describes a methodology for partitioning the wiring resource among individual physical elements of a hierarchical design in such a way as to allow the different elements (which can be at various levels of the hierarchy) to be physically wired concurrently while insuring that the overall complete design is free of shorts or other conflicts. The "wiring contract" is employed as a vehicle to pass wiring resource constraints across partitioned physical design elements as well as across the various levels of design hierarchy.

In accordance with the invention, our method for partitioning wiring connecting individual physical elements of a VLSI chip of a hierarchical design having multiple levels, begins by defining a size for the chip of a hierarchical design, and then removing blocked wiring areas, including clock and power grid areas, leaving the wiring channels available for interconnecting the individual elements of the VLSI chip. A percentage of the available area is allocated per wiring levels for global and local wiring as parallel iterations for the global and local wiring proceed and modified as the parallel iterations for the global and local wiring progress. During the parallel iterative process the number of wires may increase for the power grid area to prevent a signal wire from having an "active" wire on either side of the signal wire. In the interactive process, a vertical slice of the wiring resources used for the space above a macro entity is defined and the macro entity is checked with this context of the VLSI chip physical design above it. The process employs a blockage modeling tool to accurately wire DRC correct wiring designs using automatic routing tools. This blockage modeling tool handles the newer, more complex types of design ground rules, such as wire spacings that are functions of the wires' widths or wire spacing to via junction that are dependent on both the metal extension beyond the via junction and the width of the covering metal. It adds artificial blockages to guide the routing tools to wire a design without shorts or DRC violations when these situations force the spacings to be more than the "absolute" minimum.

These and other improvements are set forth in the following detailed description. For a better understanding of the invention with advantages and features, refer to the description and to the drawings.

Our detailed description explains the preferred embodiments of our invention, together with advantages and features, by way of example with reference to the drawings.

DETAILED DESCRIPTION OF THE INVENTION

Figure 1:
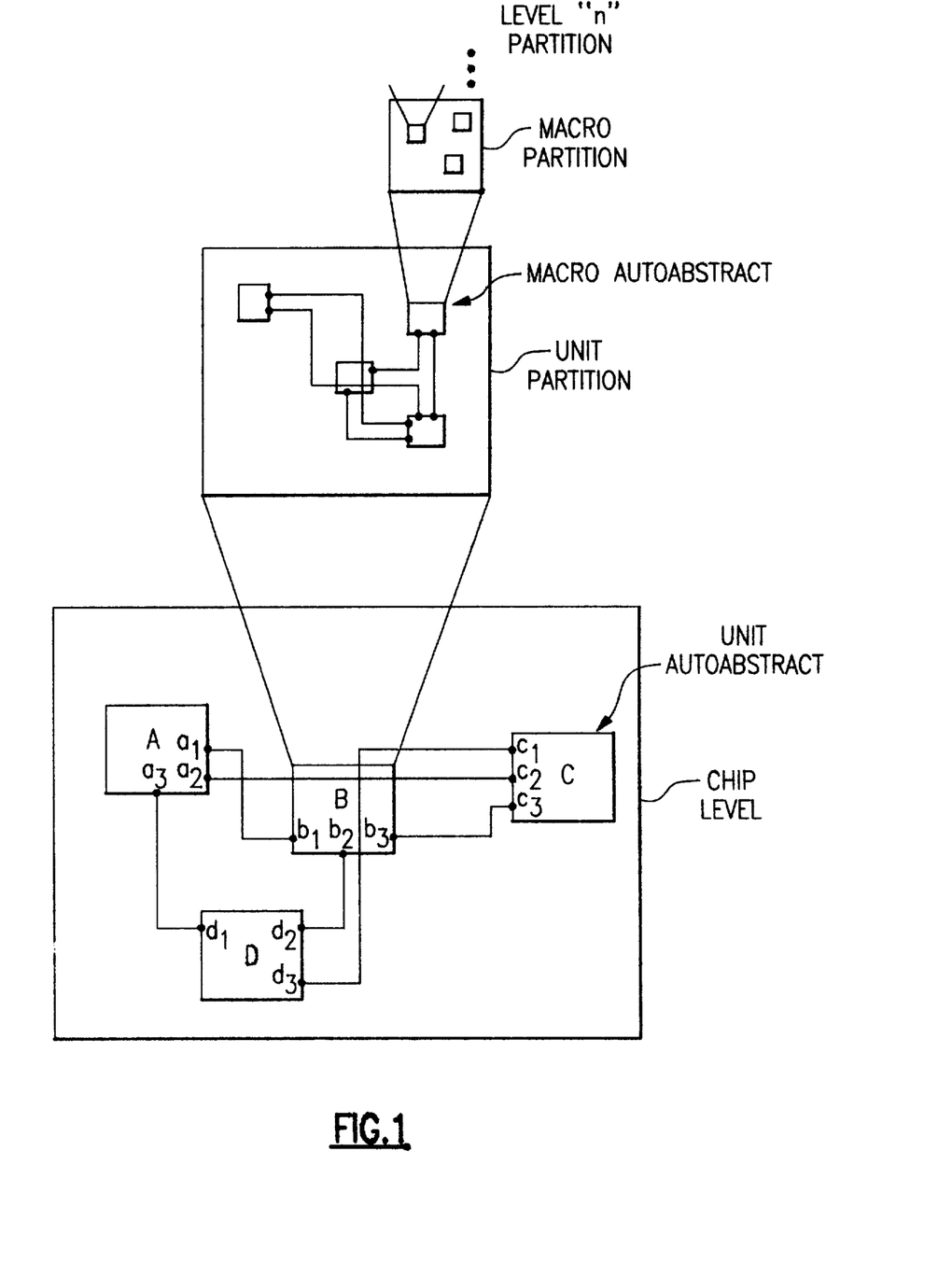
FIG. 1 illustrates partitioning of a VLSI chip.

It is assumed that the chip has been partitioned into logical partitions (units) with each partition sized and assigned a non-overlapping region of the chip area (see FIG.-1). Each partition, in turn can be further partitioned into smaller elements (macros) and each of these partitions can be further partitioned into smaller elements until you have a physical hierarchy of "n" levels, where "n" can be any integer but is typically limited to the number of levels required reach a manageable size design entity. Furthermore, each partition has a physical representation, which we will henceforth refer to as an "autoAbstract". This autoAbstract is an abstraction which contains a rectangle representing the physical size of this partition, plus terminal pins representing the physical connections to/from this partition. We will refer to the wiring between partitions as "global" wiring, and the intra-partition wiring as "local" wiring. We assume a chip floor plan has been created containing these units.

Turning now to the Figures, FIG. 1 illustrates A VLSI chip partitioned into 4 units (labeled A,B,C,D) where each of the units is further partitioned into macros and each of the macros can be further partitioned into smaller elements until you have "n" levels of physical hierarchy. Each element at each level of hierarchy can theoretically be physically designed and implemented concurrently using the techniques in this invention to manage physical constraints between the levels.

Figure 2:
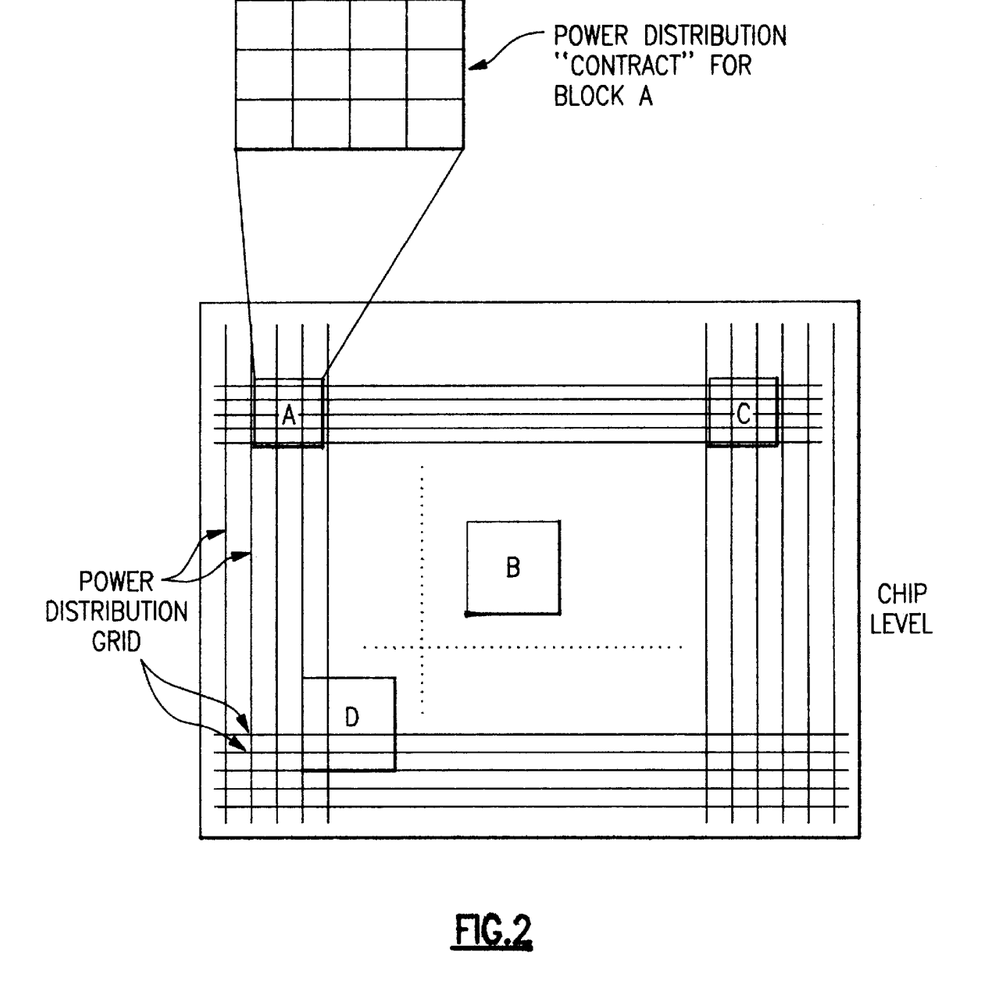
FIG. 2 illustrates some of the "fixed" wiring constraints that need to be managed and passed to the various levels of hierarchy.

FIG. 2 illustrates some of the "fixed" wiring constraints that need to be managed and passed to the various levels of hierarchy. The chip level contains a power distribution grid that runs over the air-space of the partitioned units (labeled A,B,C,D). A power distribution contract for block "A" is generated using the contract methodology described in this invention.

Figure 3:
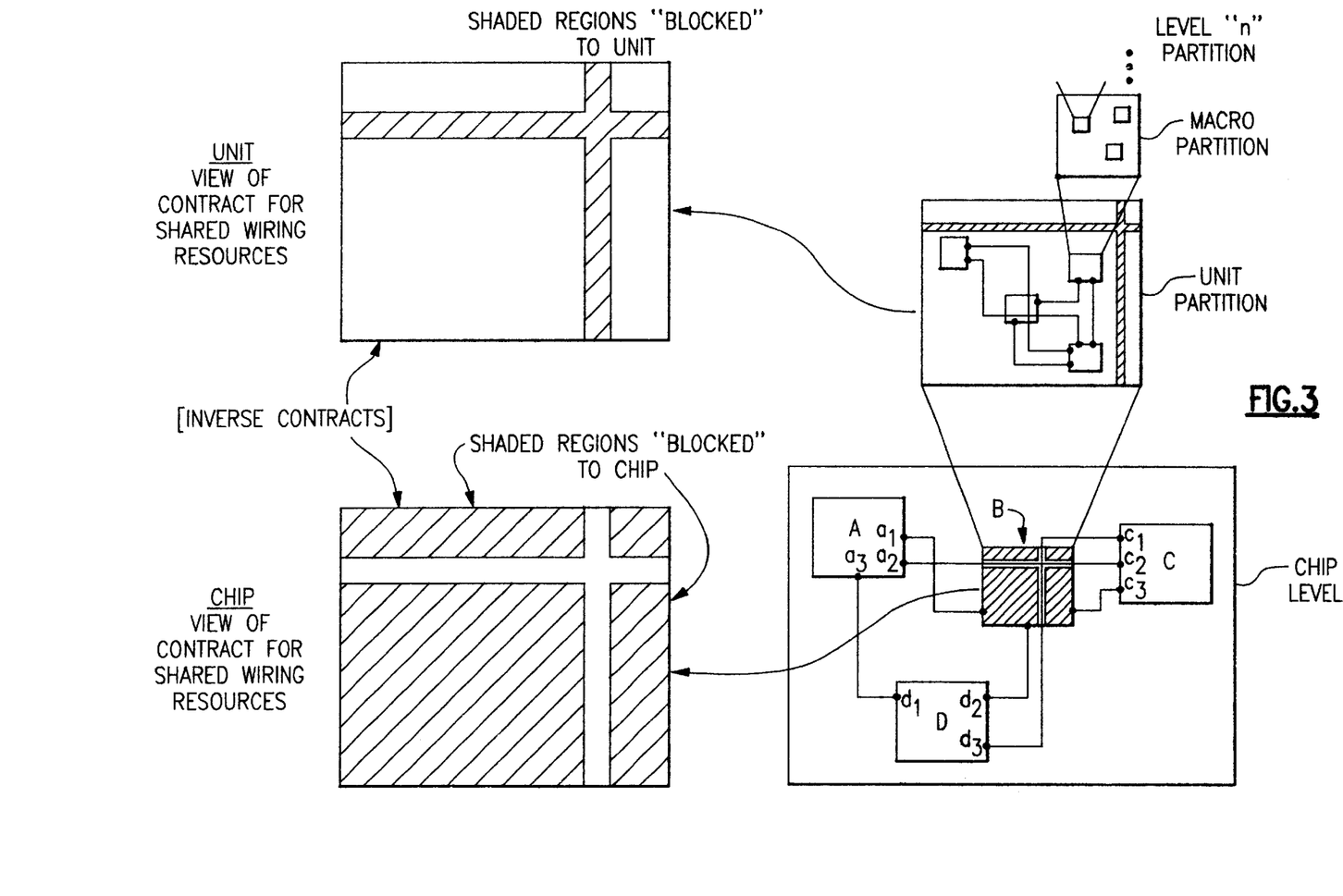
FIG. 3 illustrates contracts generated for unit and chip levels of hierarchy (which are inverses of each other) to define regions where each level of hierarchy can and can't wire.

FIG. 3 illustrates contracts generated for unit and chip levels of hierarchy (which are inverses of each other) to define regions where each level of hierarchy can and can't wire. The chip level uses wiring tracks over the airspace of the partitioned unit block B to wire the nets defined by connections to terminals a2 (on block A) and c2 (on block C) as well as terminals d3 (on block D) and c1 (on block C). These net wiring implementations require that the chip view of the wiring contract contains "open" areas where the nets can be wired and the unit view of the wiring contract represent the inverse so that the unit does not wire in the chip's space.

Figure 4:
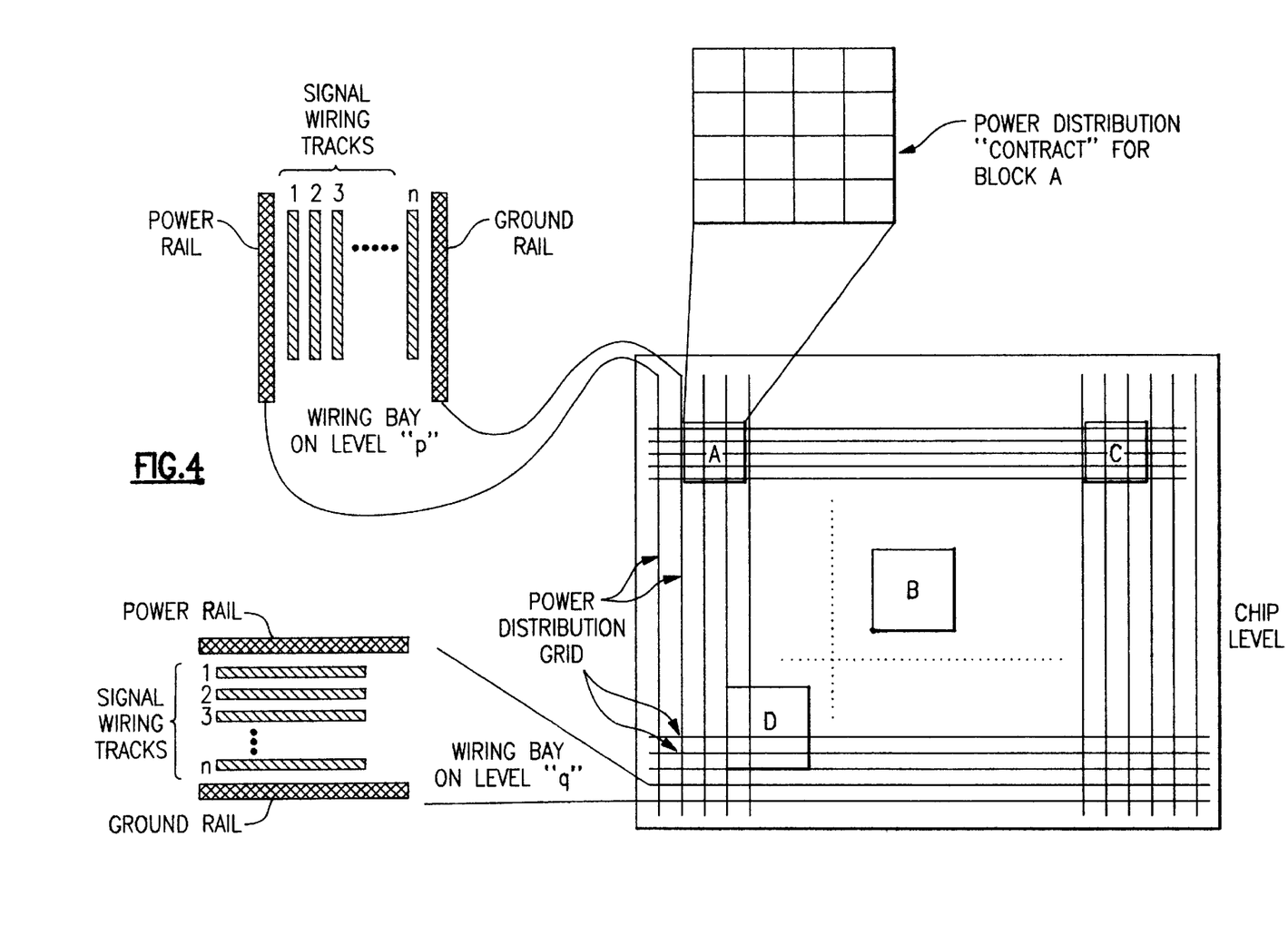
FIG. 4 illustrates the wiring bays on two levels of metal.

FIG. 4 illustrates the wiring bays on two levels of metal (labeled p,q).

Figure 5:
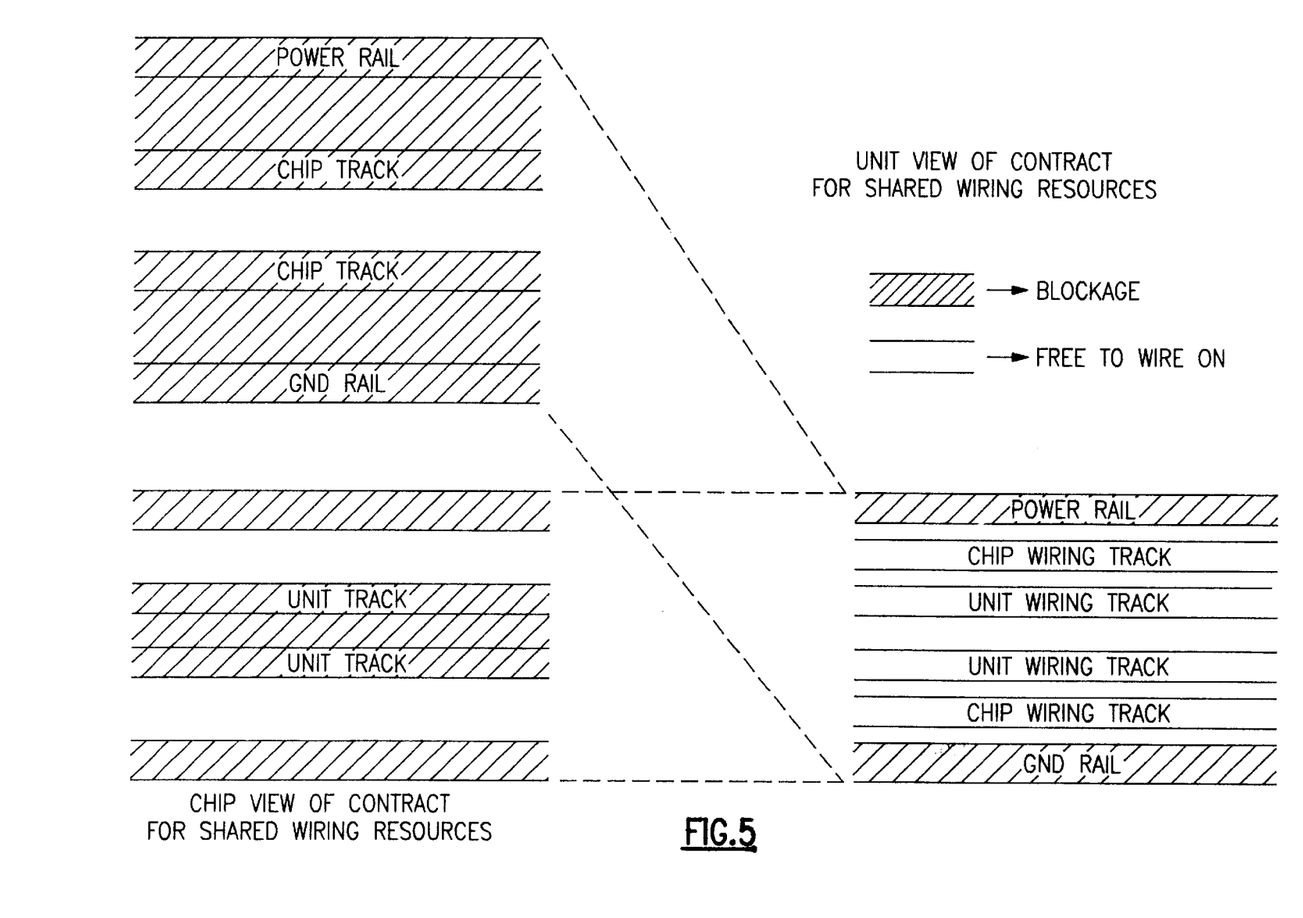
FIG. 5 illustrates a technique by which the electrical coupling between signal nets can be minimized by allocation of tracks adjacent to the power rails to the physical hierarchy level which will tend to have the longest wires.

FIG. 5 illustrates a technique by which the electrical coupling between signal nets can be minimized by allocation of tracks adjacent to the power rails (Power and Ground rails) to the physical hierarchy level which will tend to have the longest wires. In this case the wire tracks adjacent to the power rails are allocated to the chip level as illustrated in the chip view of contract. The wiring tracks that are not adjacent to the power rails are allocated to the unit partition as illustrated in the unit view of contract.

Figure 6:
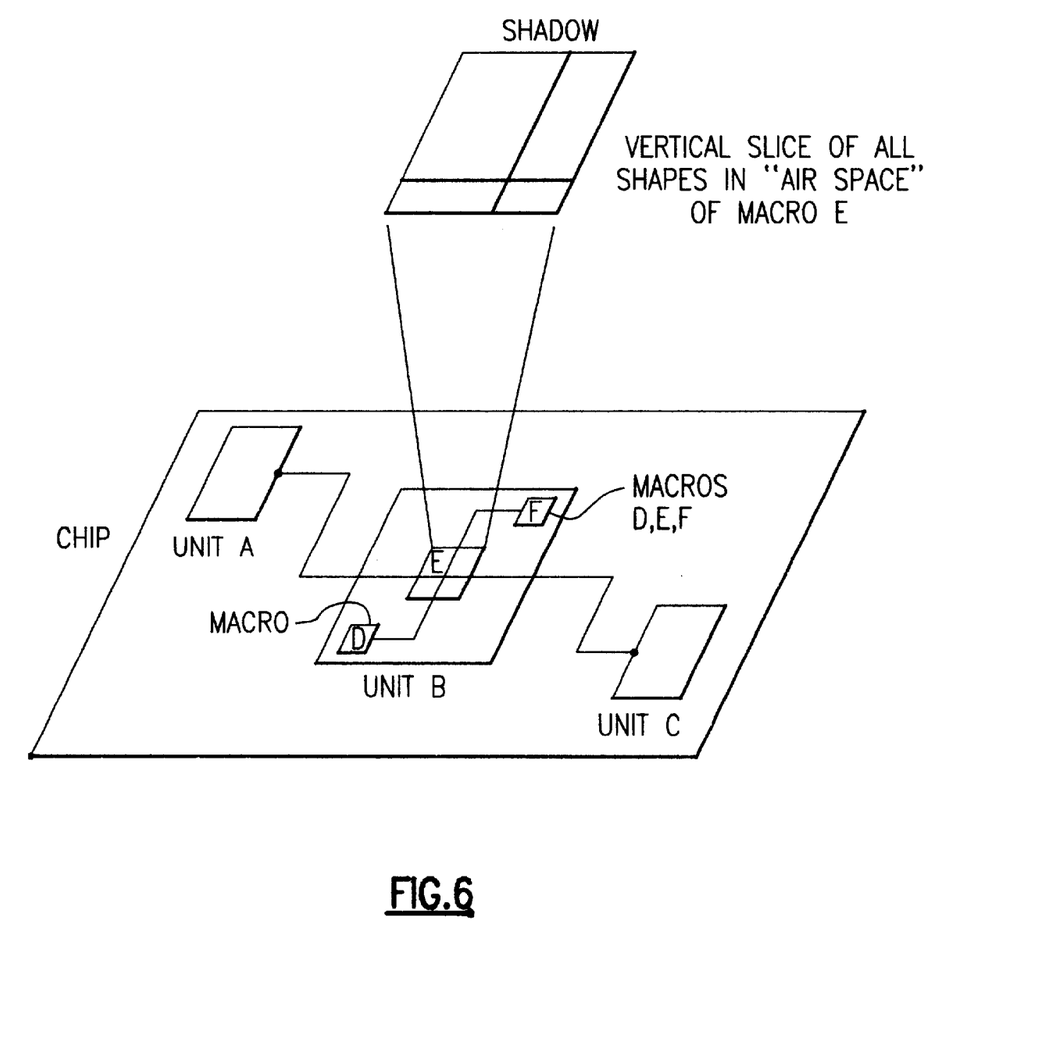
FIG. 6 illustrates a shadow generated for a specific macro design entity.

FIG. 6 illustrates a shadow generated for a specific design entity (in this case macro E). This shadow is a vertical slice up thru all wiring planes and up thru all levels of hierarchy (in this case the unit and chip levels). The shadow contains all shapes in the vertical slice, illustrated as two net segments in this example.

Figure 7:
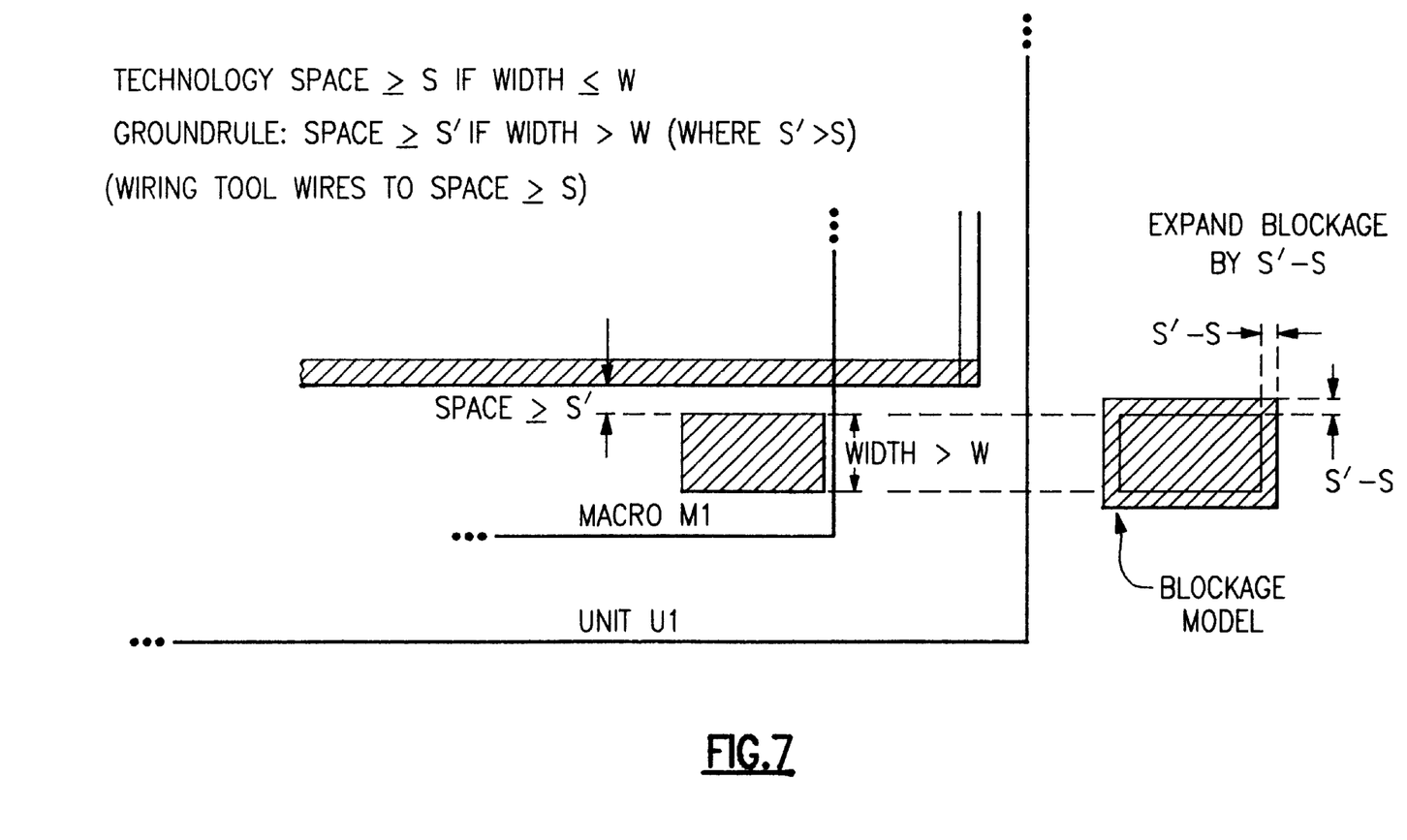
FIG. 7 illustrates the modification of the blockage model for a shape in a macro to account for complex spacing ground rules.

FIG. 7 illustrates the modification of the blockage model for a shape in macro Ml to account for complex spacing ground rules. The blockage is modeled as a larger shape (increased in size on all sides by s1-s) to allow the wiring tool to continue to wire to a simplified spacing rule (space>= s) on that level. The resulting spacing will meet the technology ground rule without complicating the wiring routine.

Thus, in the Figures we illustrate the process outlined in the steps below.

Step 1): Size the resource allocation on each wiring layer.
Considerations:
  a) Global wires should be assigned to the wiring layers of lower resistivity, as these wires tend to be longer than local wires, and hence more sensitive to RC delay and coupling effects.
  b) Reserve the "fixed" wire channels, such as power grid, clock grid, etc. These channels are blocked from both global and local wiring (see FIG.-2).
  c) Analyze low resistance wires for sensitivity to coupling noise effects. Wiring may have to be restricted on such layers, such as pre-wiring every third channel to the power grid (thus limiting the number of "active" neighboring wires to a maximum of one), and/or limiting the length of wires on these wiring layers.
  d) Allocate percentages of wiring layers to global and local wiring. This is a dynamic process in both time and space, that is, as parallel iterations of global and local wiring are done, these percentages may shift between global and local; the percentages may also be different across different areas of the chips (see FIG.-3). However, at the start before any wiring runs have been attempted, it is best to just choose just one percentage per wiring layer to keep the methodology simple.

Step 2): This is the step of building chip/partition "contracts".
  a) We assume that the power and clock grids (and any other "fixed" wiring) are built early in the design cycle, and built at the global level. For global wiring, they are instantiated right into the chip floor plan to serve as blockages. For each partition we create a blockage map of the grids by means of a shadowing program. This shadowing program will create a separate physical representation of all the grid wires over each partition and transforms the resultant blockages to that partition's origin. (Whether one physical representation is created for all "fixed" wiring or a separate physical representation for each type of "fixed" wiring is largely one of personal preference. The former conserves disk usage and accounting resource but the latter gives more flexibility for engineering changes.) We "tag" these blockages by attributes denoting their type (eg, "vdd", "gnd", "clk"). This is useful for wiring programs which can handle different wiring rules to different types of nets, as well as for determining "quiet" vs "active" wires for coupling analysis. Note that any shielding wires to restrict coupling such as that described in "1c" would be added to the power grid and propagated to each partition's blockage map(s) by the shadowing program.
  b) Using the chip physical representation with all fixed wiring included, we generate the physical representation of all available wiring channels by taking the AND-NOT of the physical size of the chip against the fixed wiring. This will generally result in wiring bays (see FIG.-4) for each wiring level as the power/clock grids (the fixed wiring) tend to run the entire lengths/widths of the chip. We now apply the preliminary percentages determined in step "1d" to determine the number of channels out of all the available channels to allocate to the partitions. A simple way to apply these percentages is to simply shrink the wiring bay by the percentage allocated to the chip, and the resultant bay will represent the wiring bay allocated for the partitions. For example, let's say the power/clock grids cuts the chip into wiring bays of 10 channels each on a particular wiring layer. The percentage we wish to allocate to the chip on this particular layer is 60%. If we shrink the 10-channel bays by 60%, then we will have 4-channel bays representing the channels allocated for the partitions. After applying this technique on every wiring layer, we now have wiring bays for each layer reserved for the partitions, or an alternate way of saying it is that we have a blockage map of the channels where we cannot put global wires in the places where those channels intersects a partition.
  c) To create the chip "contracts", ie, the blockage maps for each of the partitions in wiring the global wires, we simply run the aforementioned shadowing program against the physical representation of the wiring bays for the partitions that we created in the previous step. However, this leaves us with blockages which covers the terminal pins of each partition, and we must therefore do another AND-NOT of each partition's blockages against that partition's terminal pins (per wiring layer). These chip contracts (one per partition) are then instantiated back into the chip physical representation at their respective partition's location to be used as blockages for global wiring. To generate each partition's contract (to be used by that partition for local wiring), we take the inverse of the corresponding chip contract. This leaves us with blockages which may overlap those from the fixed wiring, so we must do an AND-NOT against the physical blockage representation(s) of the fixed wires created in "2a". Also, since we did an AND-NOT against the terminal pins during generation of the chip contract's, the space over the terminal pins were opened for the chip contract and in the inverse for the partition contract will be covered again. Therefore, we must do another AND-NOT against the terminal pins for the partition contracts.

In the past we did: 1a, 1b, 1c, 1d, 2a, 2b, 2c, but we found that deficient. In our preferred embodiment we have improved the result by adding steps 3a, 3b, 3c.

Step 3a: Our method for partitioning wiring connecting individual physical elements of a VLSI chip of a hierarchical design having multiple levels, begins by defining a size for the chip of a hierarchical design, and then removing blocked areas, including clock and power grid areas, leaving the wiring channels available for interconnecting the individual elements of the VLSI chip. A percentage of the available area is allocated for wiring levels for global and local wiring as parallel iterations for the global and local wiring proceed and modified as the parallel iterations for the global and local wiring progress. During the parallel iterative process we may also choose to change some of the available signal wiring channels into fixed power grid wires to increase the number of "quiet" wires on either side of the signal wires. The wire resource allocation defined in the wiring contracts were implemented in such a way as to reduce the coupled noise on the signal routes. This was done by taking into consideration the power distribution design and allocating the wiring track adjacent to the power distribution to the design entity which was expected to have the longest routes on that wiring level, i.e. for MQ wiring level the power distribution was defined such that 4 signal wiring tracks fit between power (VDD and GND) rails and, since the chip entity was expected to have longer routes then the unit entities, the contract was defined such that the 2 MQ tracks adjacent to power were allocated to the chip and 2 tracks not adjacent to power were allocated to unit (see FIG. 5). For the few cases where the chip wiring channel is used for a net highly sensitive to coupling, the adjacent unit wiring channel may be converted to a fixed power grid wire to reduce the coupling.

Step 3b: In the interactive process, a vertical slice of wiring resources used for the space above a macro entity is defined and the macro entity is checked with the context of the VLSI chip physical design above it. The wiring contracts were also used to be able to perform quick physical design verification of the lower levels in the design hierarchy without having the entire design in place. A vertical slice of all the wiring resources used in the airspace of a macro entity as reflected in the wiring contracts for the unit and chip could be extracted and used for verification at the macro level (see FIG.-6). Thus, one could verify that the macro physical design did not have any Physical implementation ground rule errors (violating technology specifications) or shorts to global unit and/or chip by including this vertical slice of shapes with the macro when running the checks.

Step 3c: The process employs a blockage modeling tool to accurately wire DRC correct wiring designs using automatic routing tools illustrated by the examples in the Figures. The blockage modeling tool keeps any adjacent wire at a spacing value greater that a minimum spacing away for a wire when the width of a wire is greater than a rule defined width. It also adds an artificial blockage to guide the routing tools to wire a design without shorts or DRC violations when there is a wide wire and its metal overlap past a via and its width is above a certain width and spaced less than a predetermined value from an adjacent wire on the same metal layer.

Accurate blockage modeling is essential to achieving error free, correct by design results from the automatic wiring tools. The latest BEOL technology rules create situations that without proper blockage modeling, it would be nearly impossible to achieve DRC correct designs using automatic routing tools. Two examples where blockage modeling techniques are used which result in error free designs are as follows:

The first example is when the width of a wire (such as power, clock, I/O, etc.) is greater than some value defined in the layout rules (see FIG.-7). When this occurs, any adjacent wire must be kept some spacing value greater than the minimum spacing away. There are ranges of widths/spaces to which the design must adhere. The second example involves a metal overlap past a via requirement when the metal line is above a certain width and spaced less than some value from an adjacent wire on the same metal layer. The blockage modeling code will recognize the above situations (as well as many others) and add artificial blockages where required to guide the routing tools and ensure an error free design.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for partitioning wiring connecting individual physical elements of a VLSI chip of a hierarchical design having multiple levels, comprising the steps of:

defining a size for the chip of a hierarchical design, removing blocked areas, including clock and power grid areas, leaving the wiring channels available for interconnecting the individual elements of the VLSI chip, from said available area, allocating a percentage of wiring levels for global and local wiring as parallel iterations for the global and local wiring; and as the parallel iterations for the global and local wiring progress, modifying the percentage to be allocated for global and local wiring, and during the parallel iterative process increasing the number of wires for the power grid area to prevent a signal wire from having an active wire on either side of the signal wire; and defining a vertical slice of wiring resources used for the space above a macro entity, and checking the macro entity with the context of the VLSI chip physical design above it; and implementating a blockage modeling tool to accurately wire DRC correct wiring designs using automatic routing tools and wherein said blockage modeling tool keeps any adjacent wire at a spacing value greater than a minimum spacing away from a wire when the width of a wire is greater than a rule defined width.

2. The method according to claim 1 wherein said blockage modeling tool adds an artificial blockage to guide the routing tools to wire a design without shorts or DRC violations when there is a wide wire and its metal overlap past a via and its width is above a certain width and spaced less than a predetermined value from an adjacent wire on the same metal layer.

* * * * *